(12) United States Patent
Akamatsu et al.

(10) Patent No.: US 10,734,067 B1
(45) Date of Patent: Aug. 4, 2020

(54) MEMORY DEVICE LATCH CIRCUITRY

(71) Applicant: Micron Technology, Inc., Boise, ID (US)

(72) Inventors: Hiroshi Akamatsu, Boise, ID (US); Simon J. Lovett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/551,432

(22) Filed: Aug. 26, 2019

(51) Int. Cl.
  *G11C 11/41* (2006.01)
  *G11C 11/419* (2006.01)
  *G11C 7/10* (2006.01)
  *G11C 11/412* (2006.01)

(52) U.S. Cl.
  CPC ............ *G11C 11/419* (2013.01); *G11C 7/106* (2013.01); *G11C 11/412* (2013.01); *G11C 11/41* (2013.01)

(58) Field of Classification Search
  None
  See application file for complete search history.

(56) References Cited

U.S. PATENT DOCUMENTS

| 7,420,835 B2* | 9/2008 | Wang | G11C 7/12 365/154 |
| 2009/0147561 A1* | 6/2009 | Sasaki | G11C 5/025 365/156 |
| 2016/0180923 A1* | 6/2016 | Kamohara | H04B 1/385 365/156 |

* cited by examiner

*Primary Examiner* — Tan T. Nguyen
(74) *Attorney, Agent, or Firm* — Fletcher Yoder, P.C.

(57) ABSTRACT

Latch circuitry configured to latch data for use in the memory device. The latch circuitry includes latch cells each configured to store a bit of the data. The latch circuitry also includes a data line coupled to a first side of the latch cells and a data false line coupled to a second side of the latch cells. The latch circuitry also includes a write driver that includes an input configured to receive the data to be stored in the latch cells and a pair of inverters coupled to the input and configured to output a data signal to a first side of the latch cells. The latch circuitry also includes an inverter coupled to the input and configured to generate a data false signal to a second side of the latch cells. The data used to generate the data false signal is not passed through the pair of inverters.

20 Claims, 9 Drawing Sheets

US 10,734,067 B1

MEMORY DEVICE LATCH CIRCUITRY

BACKGROUND

Field of the Present Disclosure

Embodiments of the present disclosure relate generally to the field of semiconductor devices. More specifically, embodiments of the present disclosure relate to using latch circuitry for a memory device.

Description of Related Art

Semiconductor devices (e.g., memory devices) may latch cells to store data. For example, a six-transistor (6T) static random access memory (SRAM) may be used as a latch cell. The 6T SRAM and/or other suitable circuitries may be used for local redundancy fuse latches as a method to reduce the footprint of the latch area and die size. However, these compact latch cells may be susceptible to noise generated during multiple cell writes (e.g., a reset during a power up of the memory device) causing potential data corruption in one or more of the cells.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Fuse latch cells in a semiconductor device may use architectures (e.g., 6T SRAM) that are compact but may be susceptible to noise when driving circuitry is used to flip the data in the cells. The cells may be periodically inverted to periodically stress and relax the memory cells to alleviate negative bias temperature instability (NBTI) degradation. However, when the write driver for these memory cells is used to invert the data in a periodic data flipping the latched data may capture errors that may cause unintended operation. Specifically, data inversion may cause disturbances on the Df line. When the data (D) side of the cells are written using a D line derived from the Df line, the disturbances on the Df line may cause corrupted data on the D line. Instead, an independent write driver may be used to separate the D and Df lines. Furthermore, the write driver may not have sufficient strength to pull down at various power conditions (e.g., a low-voltage process corner) due to p-channel source terminals fighting D and Df pulldowns. To assist in this situation, generation circuitry may be used to apply cutoff power to the p-channel source terminals to block the p-channel source terminals from fighting the pulldowns.

Figure 1:
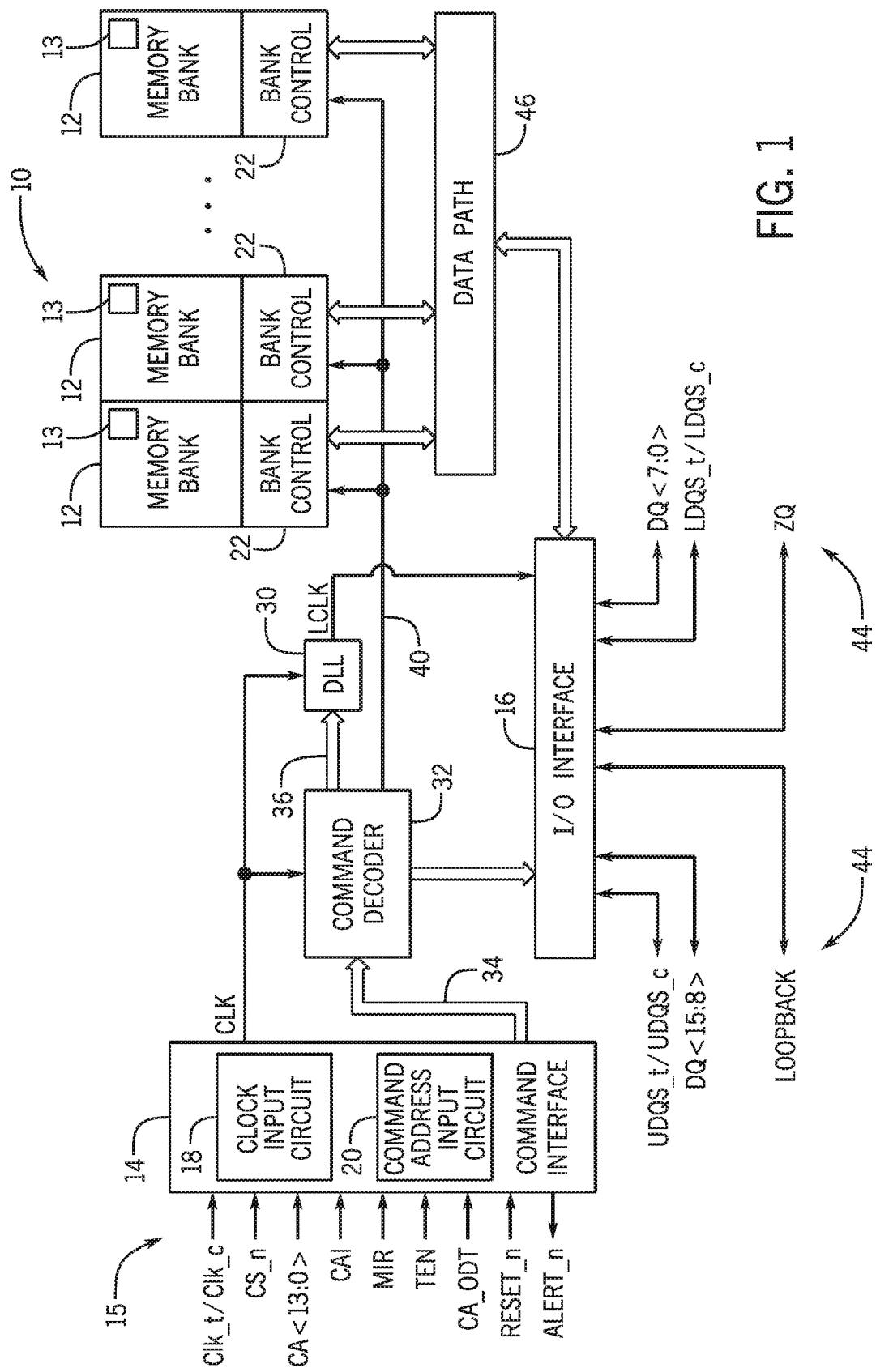
FIG. 1 is a simplified block diagram illustrating certain features of a memory device including latch circuitry having one or more latch cells, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system. The memory banks 12 may utilize latch circuitry 13 to store information (e.g., fuse data). As previously mentioned and to be discussed in more detail below, the latch circuitry 13 may include the write driver and power assisting generation circuitry used to control writing to cells of the latch circuitry 13. Although the illustrated latch circuitry 13 may be illustrated as located in the memory banks 12, in some embodiments, the latch circuitry 13 may be located in any suitable location in the memory device 10 (e.g., bank control 22 used to control the memory banks 12).

The memory device 10 may include a command interface 14 and an input/output (110) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/ crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal, and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control 22 which provides the necessary decoding (e.g., row decoder and column decoder), as well as other features, such as timing control and data control, to facilitate the execution of commands to and from the memory banks 12. For instance, bank control 22 may use data stored in the latch circuitry 13 for memory redundancy (e.g., row redundancy and/or column redundancy) to control routing of data for storage and/or retrieval from storage cells of the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like during power-up, for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_b), the DQS signals may be provided as a differential pair of data strobe signals (DQS_t/ and DQS_b) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_b; LDQS_t/ and LDQS_b) corresponding to upper and lower bytes of data sent to and from the memory device 10, for instance.

An impedance (ZQ) calibration signal may also be provided to the memory device 10 through the TO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the TO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
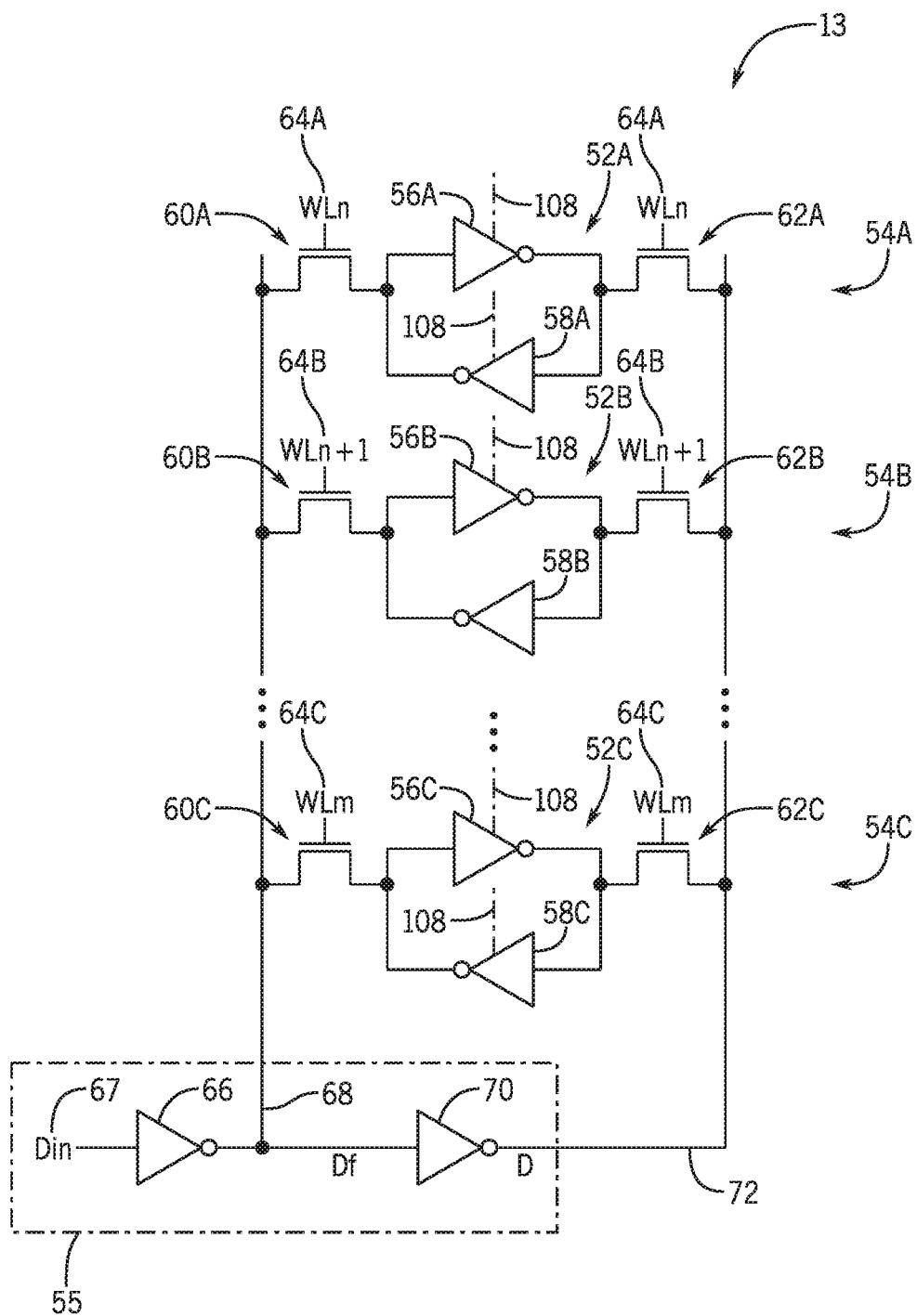
FIG. 2 is a schematic view of the latch circuitry of FIG. 1 with each latch cell having two inverters, according to an embodiment of the present disclosure.

FIG. 2 illustrates a schematic diagram of an embodiment of the latch circuitry 13. As illustrated, the latching circuitry 13 includes multiple latch cells 52 that function as row redundancy fuse latch sets 54. The latching circuitry 13 may include any number of latch cells 52 that share fuse data from a write driver 55. For instance, 16 row redundancy fuse latch sets 54 may be included in each latch circuitry 13 for each 16 row addresses. Additionally or alternatively, the latch cells 52 may be used for other types of redundancy schemes, such as column redundancy schemes. As previously mentioned, the latch cells 52 may be 6T SRAM cells. Specifically, the latch cells 52 may include inverters 56 and 58 that may each be implemented using dual-transistors, as discussed below in relation to FIG. 3. Each latch cell 52 also includes a left access transistor 60 and a right access transistor 62 that selectively couple the inverters 56 and 58 to a data false (DO line 68 and a data line (D) line 72 based on a corresponding word line (WL) signal 64. The inverters 56 and 58 are coupled in reverse orientations in relation to each other relative to the left access transistor 60 and the right access transistor 62. The Df line 68 and the D line 72 are used to write data to and/or read data from the inverters 56 and 58. To write data to the inverters 56 and 58, the write driver 55 asserts a voltage on the inverters 56 and 58.

Figure 3:
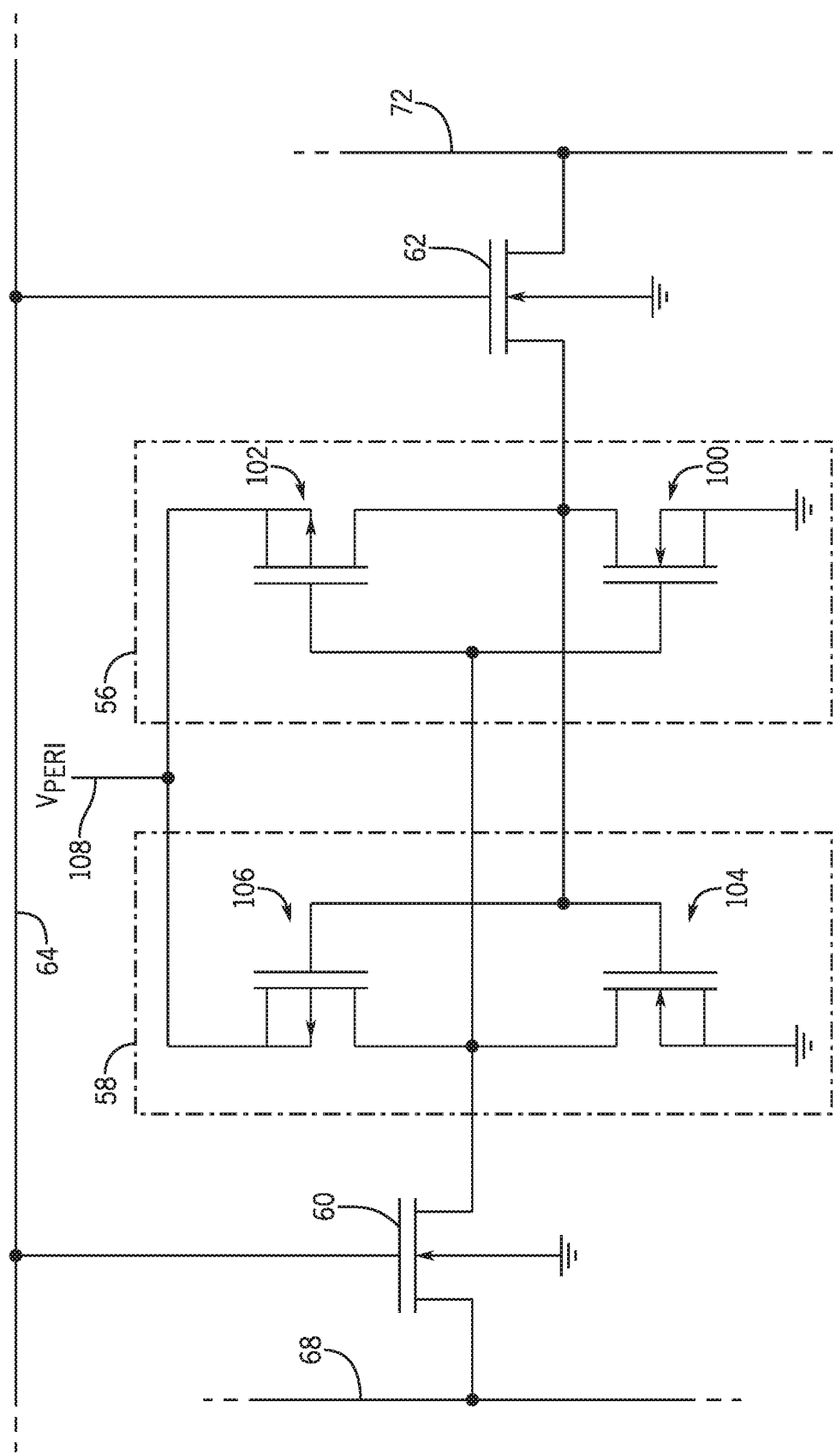
FIG. 3 is a schematic view of a latch cell of FIG. 2 with the inverters each implemented using a transistor pair, according to an embodiment of the present disclosure.

FIG. 3 is a schematic diagram of an embodiment of the latch cell 52 having a 6T SRAM arrangement with the inverters 56 and 58. As illustrated, the inverter 56 includes an NMOS transistor 100 and a PMOS transistor 102 that each have their gates coupled to the left access transistor 60 (here illustrated as an NMOS transistor) and have an output between them coupled to a right access transistor 62 (here illustrated as an NMOS transistor). The output is located where the drain terminals of both the NMOS transistor 100 and the PMOS transistor 102 are coupled together. In other words, the drain terminals of the NMOS transistor 100 and the PMOS transistor 102 are coupled together and to the right access transistor 62. The inverter 58 includes an NMOS transistor 104 and a PMOS transistor 106 that each have their gates coupled to the right access transistor 60 and an output between them coupled to the left access transistor 60. The output is located where the drain terminals of both the NMOS transistor 104 and the PMOS transistor 106 are coupled together. In other words, the drain terminals of the NMOS transistor 104 and the PMOS transistor 106 are coupled together and to the right access transistor 62. A voltage 108 provides power to the PMOS transistors 102 and 106 via the source of the PMOS transistors 102 and 106. The source terminals of the NMOS transistors 100 and 104 may be coupled to ground.

Returning to FIG. 2, the write driver 55 includes an inverter 66 that receives a fuse data input (Din) 67 that inverts the Din 67 to generate the Df line 68. Similarly, an inverter 70 is used to invert the Df line 68 to generate the D line 72. However, with the write driver shared between multiple latch cells 52 and the use of the write driver 55 to drive the multiple latch cells 52 concurrently in some scenarios (e.g., data flip), the write driver 55 may fail to write a correct value through to the D line 72.

Figure 4:
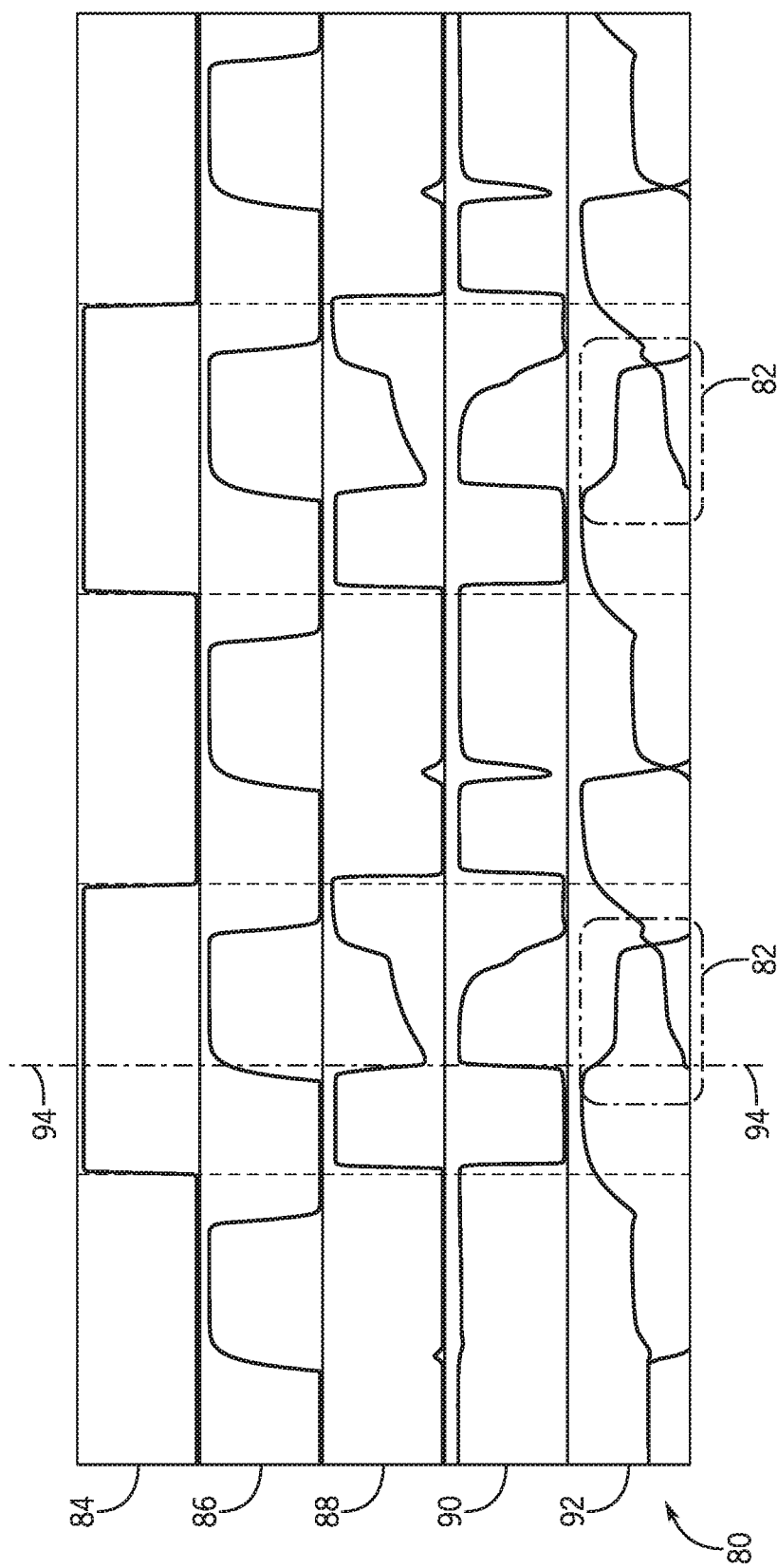
FIG. 4 is a graph of signals used in the latch circuitry of FIG. 2, according to an embodiment of the present disclosure.

Specifically, FIG. 4 illustrates a graph 80 that reflects voltages in the latch cells 52 that cause a write error 82 when attempting to write to multiple latch cells 52 concurrently. The graph 80 includes a write data line 84 that corresponds to Din 67. The graph 80 also includes a WL line 86 that corresponds to a respective WL signal 64. Moreover, the graph 80 includes a driver output line 88 that corresponds to the D line 72. Additionally, the graph 80 includes a driver output false line 90 that corresponds to the Df line 68. Furthermore, the graph 80 includes latch node lines 92 that respectively correspond to voltages stored in the inverters 56 and 58. At a time 94, when the respective WL signal 64 transitions high, the left and right access transistors 60 and 62 couple the latch cells 52 to the write driver 55. When the Df line 68 is driven to multiple latch cells 52 concurrently, the driving creates noise on the Df line 68. This noise is then propagated from the Df line 68 to the D line 72 via the inverter 70 causing the data on the D line 72 to become incorrect.

Figure 5:
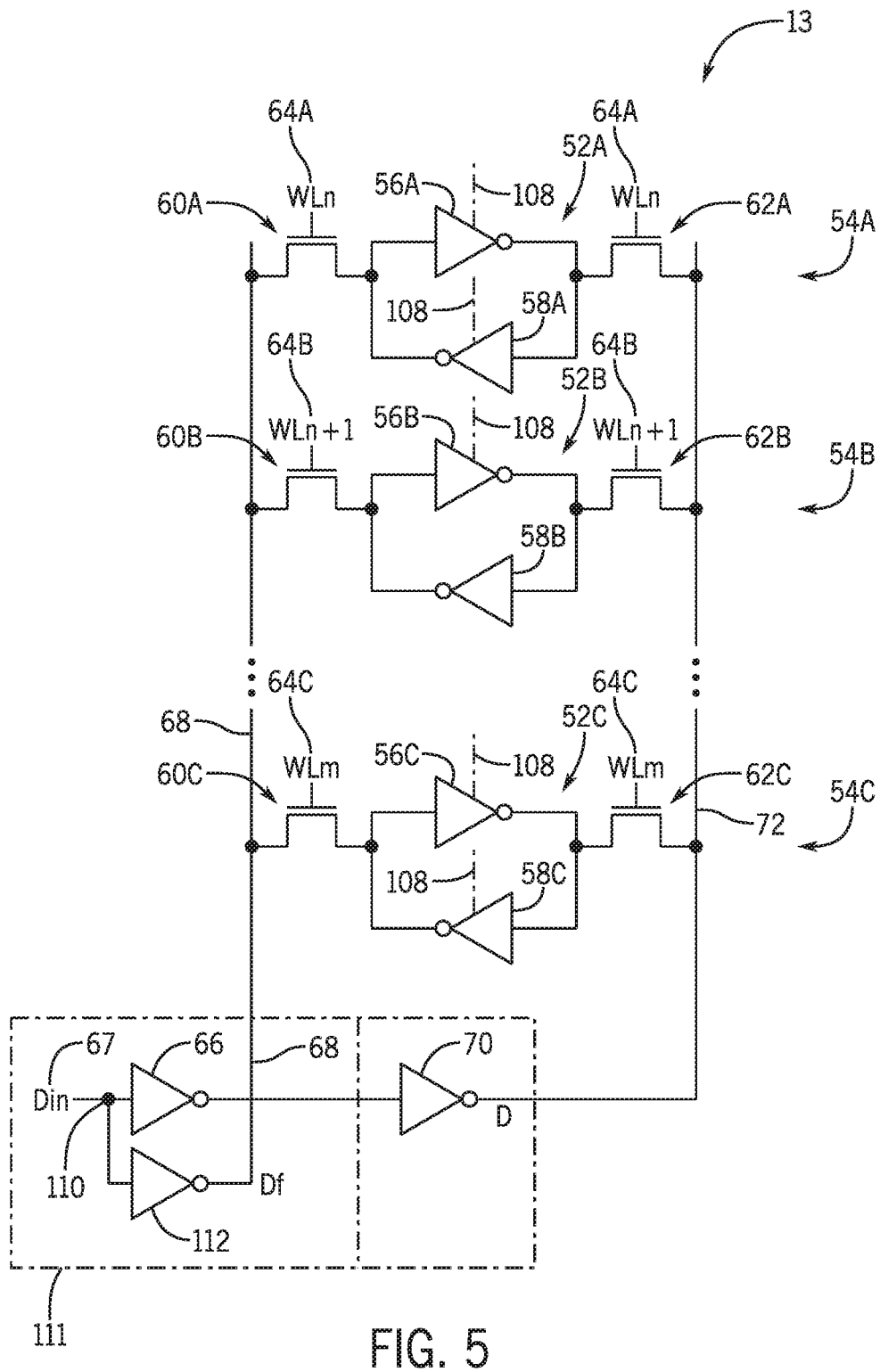
FIG. 5 is a schematic view of the latch circuitry of FIG. 1, according to an embodiment of the present disclosure.

To address this write error, FIG. 5 illustrates an embodiment of the latch circuitry 13 using a write driver 111 that generates the Df line 68 independently of the D line 72. Specifically, the write driver 111 includes a node 110 where generation for the Df line 68 is split from generation of the D line 72. Generation of the D line 72 proceeds through the inverters 66 and 70 similar to the generation of the D line 72 in the write driver 55. Generation of the Df line 68 flows through a separate inverter 112 in the write driver 111 rather than using the inverter 66. By separating generation of the Df line 68 and the D line 72, any noise resulting on the Df line 68 and/or the D line 72 are not propagated to the other line thereby block such propagation-based write errors, such as the errors 82.

In addition to write errors based on feedback propagation between the Df line 68 and the D line 72, the write driver 55 and/or write driver 111 may experience issues pulling down the inverters 56 and 58 of multiple latch cells 52 in certain conditions (e.g., low-voltage and/or process corners). This difficulty in completing pull-downs is due to the PMOS transistors 102 and 106 fighting the pull-downs. In other words, the write driver 55 and/or 11 may not be strong enough to pull down the inverters 56 and 58 in the certain conditions due to relatively large current flow from the voltage 108 of latch cells 52 to VSS of the write driver 111. This bus contention hurts the write speed of the latch cells 52.

Figure 6:
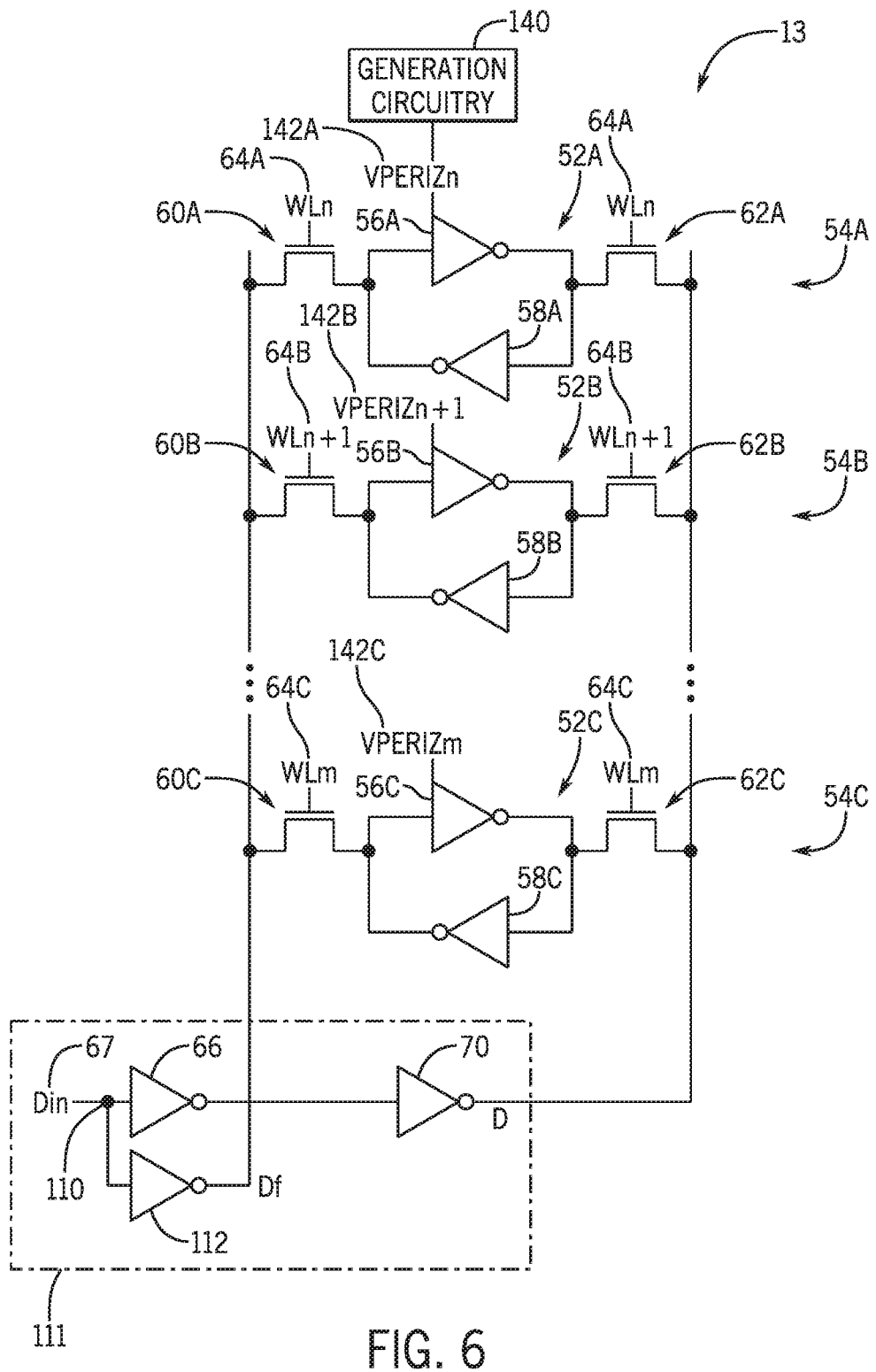
FIG. 6 is a schematic view of the latch circuitry of FIG. 4 with write power assist using generation circuitry to assist in writes to the latch circuitry, according to an embodiment of the present disclosure.

To address this potential problem, the latching circuitry 13 may provide write assist power gating by replacing the connection of the voltage 108 to the inverters 56 and 58 with a connection between the dynamic voltages 142 and the inverters 56 and 58. The dynamic voltages 142 may be shut off during a cell write period in which the WL signal 64 is high. To provide such write assistance, at least some embodiments of the memory device 10 may include one or more latch cells 52 that cut off voltage from the PMOS transistors 102 and 106. For instance, FIG. 6 illustrates an embodiment of the latch circuitry 13 with the write driver 111 using generation circuitry 140 to generate dynamic voltages for the latch cells 52 to cut off the respective PMOS transistors 102 and 106 from the voltage 108 to assist the write driver 111. The latch circuitry 13 of FIG. 6 is the same as the latch circuitry 13 of FIG. 5 except that the latch circuitry 13 of FIG. 6 includes the generation circuitry 140 that generates dynamic voltages 142 for the latch cells 52.

Figure 7:
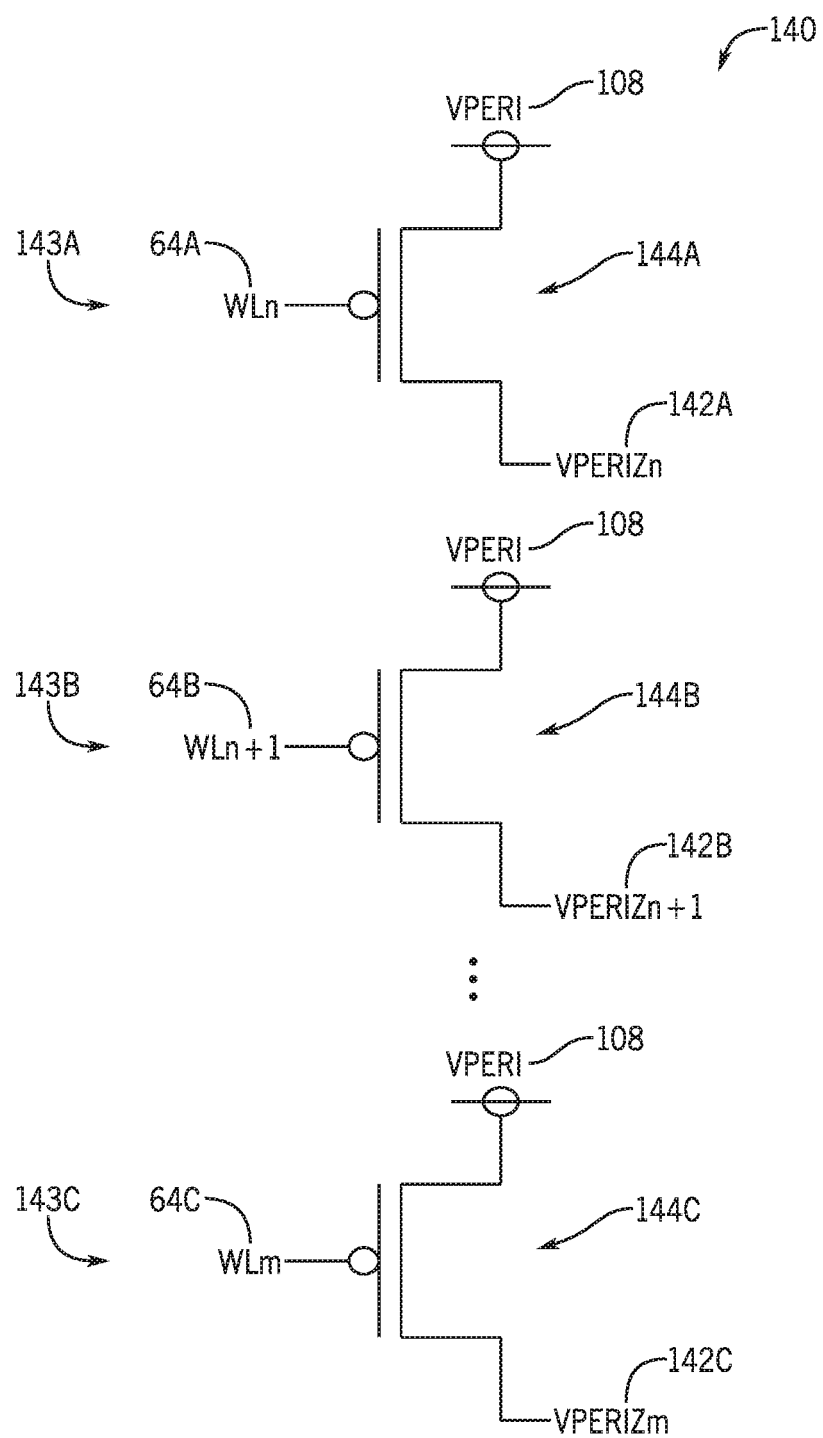
FIG. 7 is a schematic view of the generation circuitry of FIG. 6, according to an embodiment of the present disclosure.

FIG. 7 is a schematic diagram of an embodiment of the generation circuitry 140. As illustrated, the generation circuitry 140 includes sub-circuits 143 for each latch cell 52 includes a PMOS transistor 144 that couples the voltage 108 to the dynamic voltage 142 for the corresponding latch cell 52 unless the WL signal 64 corresponding to the respective latch cell 52 is asserted. Upon assertion of the WL signal 64 corresponding to the respective latch cell 52, the PMOS transistor 144 cuts off the connection between the voltage 108 and the dynamic voltage 142. Cutting off the connection between the voltage 108 and the dynamic voltage 142 removes power from the PMOS transistors 102 and 106 of the inverters 56 and 58. Removing power from the PMOS transistors 102 and 106 of the inverters 56 and 58 eases an amount of strength needed to be asserted by the write driver 111 to pull the inverters 56 and 58 down on respective cycles.

Figure 8:
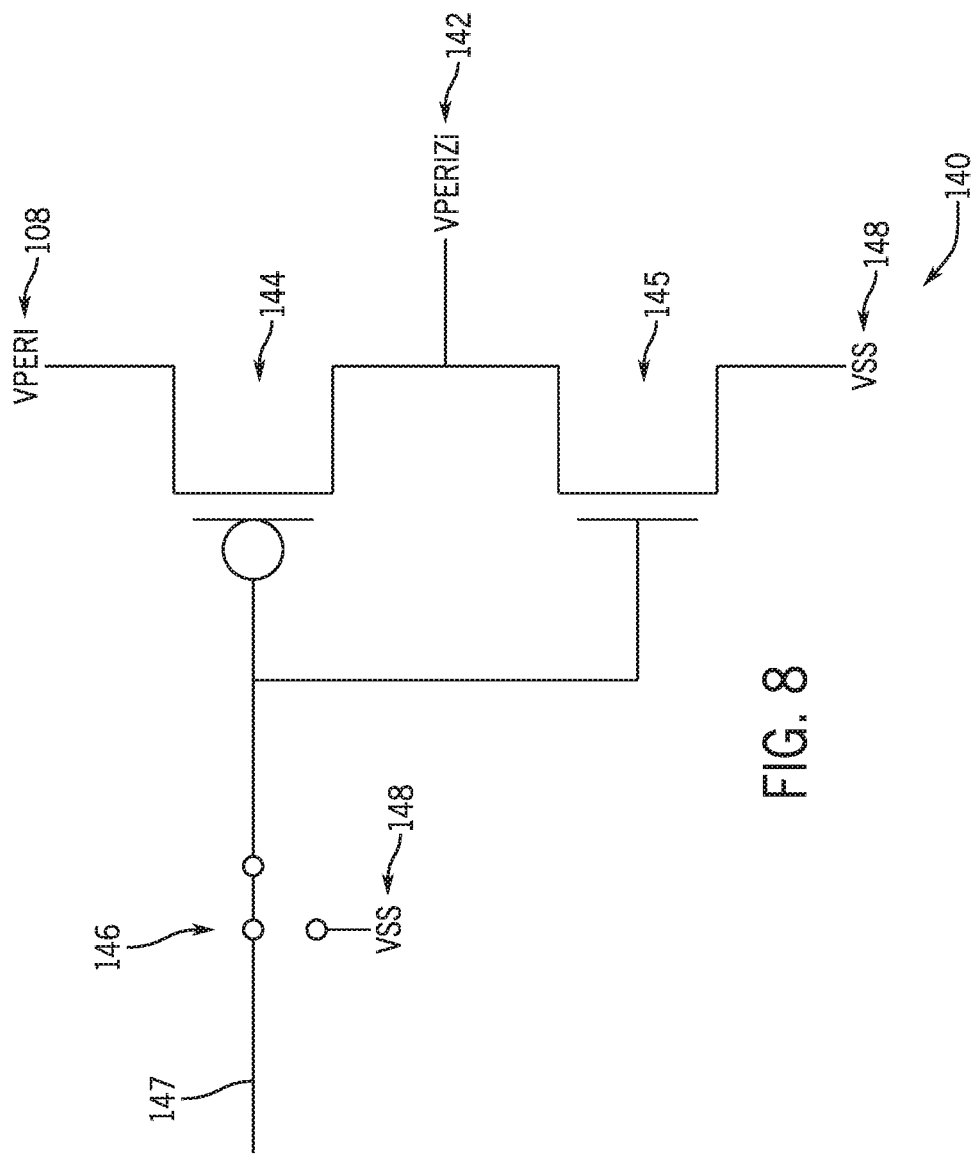
FIG. 8 is a schematic view of a portion of the generation circuitry of FIG. 6, according to an embodiment of the present disclosure.

FIG. 8 illustrates an alternative embodiment of a portion of the generation circuitry 140. In the portion of the generation circuitry of FIG. 8, an NMOS transistor 145 is used to couple and decouple a corresponding dynamic voltage 142 from VSS 148. A switch is used to selectively toggle connection of a drive voltage 147 and VSS 148. Since the NMOS transistor 145 and the PMOS transistor 144 have their gates coupled to the switch 146. When the switch 146 couples the drive voltage 147 to the gates of the NMOS transistor 145 and the PMOS transistor 144, the PMOS transistor 144 cuts off the connection between the voltage 108 and the dynamic voltage 142 while coupling the dynamic voltage 142 to the VSS 148. In other words, when the switch 146 passes the drive voltage 147, it causes the dynamic voltage 142 to be tied to VSS 148. Otherwise, the dynamic voltage 142 is tied to the voltage 108.

Figure 9:
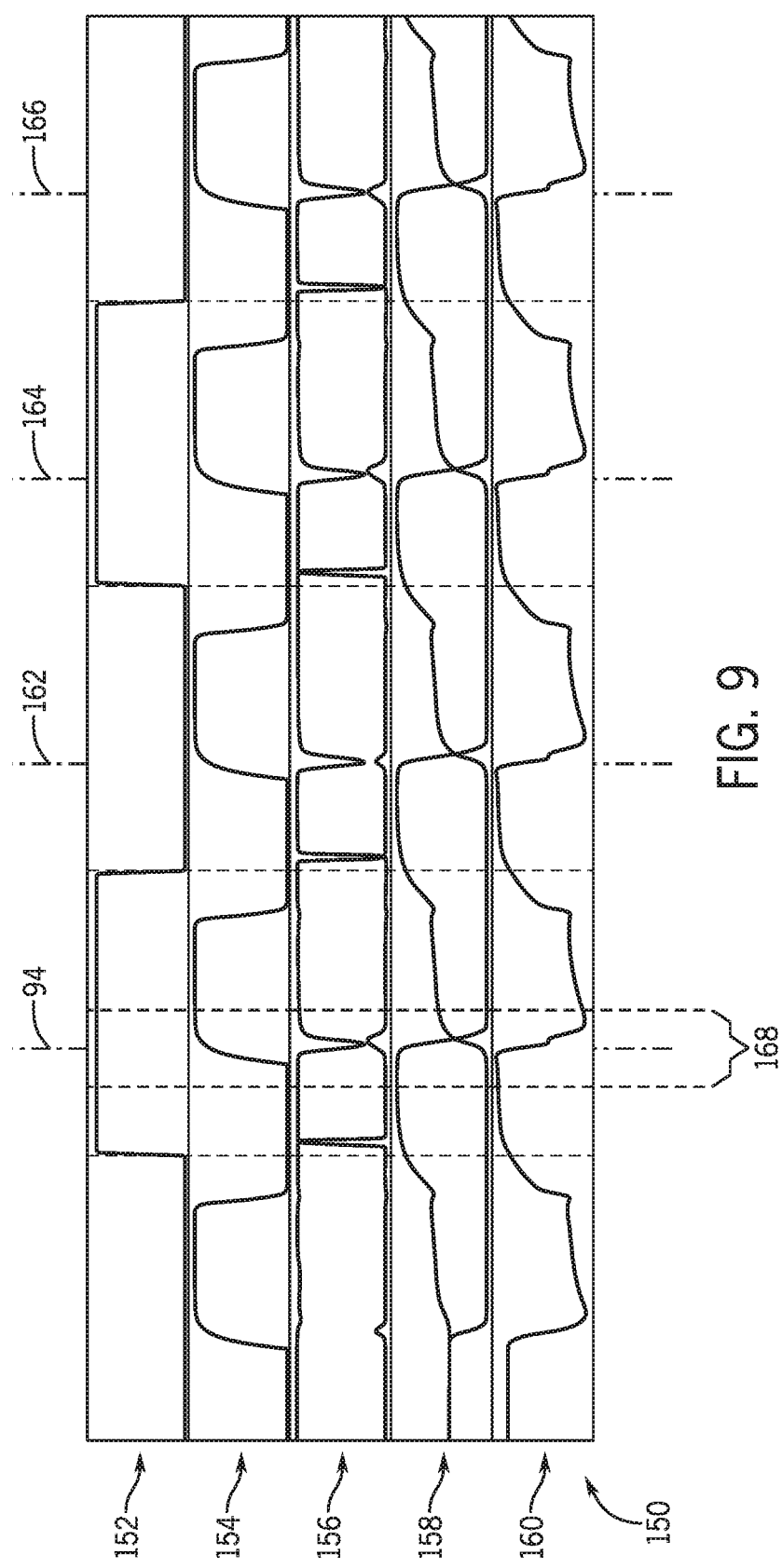
FIG. 9 is a graph of signals in the latch circuitry of FIG. 6, according to an embodiment of the present disclosure.

FIG. 9 illustrates a graph 150 of an embodiment of signals in the latch circuitry 13 of FIG. 6. As illustrated, the graph 150 includes a write data line 152 corresponding to the Din 67 and a WL line 154 corresponding to a WL signal 64 for a respective latch cell 52. The graph 150 also includes write driver output lines 156 that correspond to the Df line 68 and the D line 72. The graph 150 also includes latch lines 158 corresponding to data stored in the latch cell 52. Furthermore, the graph 150 includes a dynamic voltage line 160 that corresponds to the dynamic voltage 142 of the latch cell 52. Based at least in part on the use of the separately generated Df line 68 and D line 72, noise is not propagated between the Df line 68 and the D line 72 as illustrated in the write driver output lines 156. Specifically, no propagation-based error occurs on the latch lines 158 at time 94 when writing to multiple latch cells 52 concurrently in a data flip. Furthermore, using the write assistance from the generation circuitry 140, the dynamic voltage 142 (as illustrated by the dynamic voltage line 160) for the latch cell 52 is cut off at time 94. The dynamic voltage 142 is also cut off at and each subsequent pulse of the WL line 154 at times 162, 164, and 166. Since one of the inverters 56 or 58 is pulled down with each write, each pulse of the WL line 154 causes a corresponding change in the dynamic voltage line 160 that shuts off power to the PMOS transistors 102 and 106 to aid in a pull down of a corresponding voltage stored in the latch cell 52 at times 94, 162, 164, and 166. As previously discussed, this shut off of a supplied voltage to the PMOS transistors 102 and 106 enables the write driver 111 to pull down the inverters 56 and 58 even in conditions where pulling down the inverters 56 and 58 would utilize more pull-down force than the write driver is capable of applying without the write assist power gating. Although the illustrated turn off timing for the dynamic voltage 142 occurs at a specific time based on the WL line 154, in some embodiments, the turn off timing for the dynamic voltage 142 may be more flexible than a specific time. For example, a delay between assertion of the WL line 154 and the dynamic voltage 142 may occur. Additionally or alternatively, the switch 147 may be switched at any suitable time even during SRAM changing. For example, any period within a dynamic voltage turning off period 168 may be used even including a period in which the SRAM is changing.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter (e.g., inverter 66) replaced with a single NAND gate and/or an amplifier or other similar changes. Similarly, the foregoing discusses using metal oxide semiconductor field effect transistors (MOSFETs) of various types, but some embodiments may replace at least one MOSFET with another suitable types of transistor, such as bipolar junction transistor (BJT), junction gate field-effect transistor (JFET), and/or the like.

While the present disclosure may be susceptible to various modifications and alternative forms, specific embodiments have been shown by way of example in the drawings and have been described in detail herein. However, it should

What is claimed is:

1. A memory device, comprising:
    latch circuitry configured to latch data for use in the memory device, wherein the latch circuitry comprises:
        a plurality of latch cells each configured to store a bit of the data;
        a write driver, comprising:
            an input configured to receive the data to be stored in the plurality of latch cells;
            a pair of inverters coupled to the input and configured to output a data signal to a first side of the plurality of latch cells; and
            an inverter coupled to the input and configured to generate a data false signal to a second side of the plurality of latch cells, wherein the data used to generate the data false signal is not passed through the pair of inverters.

2. The memory device of claim 1, wherein the first side comprises a left side of the plurality of latch cells, and the second side comprises a right side of the plurality of latch cells.

3. The memory device of claim 1, comprising generation circuitry configured to generate dynamic voltages that are supplied to the latch cells.

4. The memory device of claim 3, wherein the generation circuitry comprises a plurality of sub-circuits each corresponding to latch cell of the plurality of latch cells.

5. The memory device of claim 4, wherein each sub-circuit comprises a PMOS transistor configured to selectively decouple a respective dynamic voltage from a supply voltage based at least in part on a word line signal transitioning high for the corresponding latch cell.

6. The memory device of claim 4, wherein each sub-circuit comprises
    a PMOS transistor configured to selectively decouple a respective dynamic voltage from a supply voltage;
    a NMOS transistor configured to selectively couple the respective dynamic voltage to a second voltage; and
    a switch coupled to the gates of the PMOS transistor and the NMOS transistor to selectively connect to a first pole to drive the respective dynamic voltage to the supply voltage or to selectively connect to a second pole to drive the respective dynamic voltage to the second voltage.

7. The memory device of claim 1, wherein each latch cell comprises:
    a first access transistor that selectively provides access to the latch cell via the first side of the plurality of latch cells; and
    a second access transistor that selectively provides access to the latch cell via the second side of the plurality of latch cells.

8. The memory device of claim 7, wherein each latch cell comprises:
    a first inverter coupled between the first access transistor and the second access transistor; and
    a second inverter coupled between the first access transistor and the second access transistor, wherein the first and second inverters are disposed in opposite orientations in relation to the first access transistor and the second access transistor.

9. The memory device of claim 8, wherein:
    the first inverter comprises:
        a first NMOS transistor; and
        a first PMOS transistor, wherein gates of the first NMOS transistor and the first PMOS transistor are coupled to the first access transistor, and drain terminals of the first NMOS transistor and the first PMOS transistor are coupled to the second access transistor; and
    the second inverter comprises:
        a second NMOS transistor; and
        a second PMOS transistor, wherein gates of the second NMOS transistor and the second PMOS transistor are coupled to the second access transistor, and the drain terminals of the second NMOS transistor and the second PMOS transistor are coupled to the first access transistor.

10. The memory device of claim 9, wherein source terminals of the first and second PMOS transistors are coupled to a voltage supply.

11. The memory device of claim 9, comprising a voltage transistor configured to selectively couple source terminals of the first and second PMOS transistors to a voltage supply based at least in part on a word line signal configured to control access to the via the first and second access transistors.

12. The memory device of claim 11, wherein the voltage transistor comprises a PMOS transistor configured to decouple the source terminals of the first and second PMOS transistors from the voltage supply based at least in part on an assertion of the word line signal.

13. A method comprising:
    receiving data to be stored in a plurality of latch cells;
    generating a data false signal using a data false inverter to invert the data;
    generating a data signal using an inverter pair, wherein the data used to generate the data false signal does not pass through the inverter pair used to generate the data signal;
    driving a first side of the plurality of latch cells using the data false signal; and
    driving a second side of the plurality of latch cells using the data signal.

14. The method of claim 13, comprising decoupling p-channels of inverters of a latch cell of the plurality of latch cells from a voltage source when pulling down a voltage stored in latch cell.

15. The method of claim 14, wherein decoupling the p-channels of the inverters of the latch cell is based at least in part on a word line signal.

16. The method of claim 15, wherein driving the first and second side of the latch cells comprises writing to the latch cell based at least in part on the word line signal enabling access to the latch cell from the first side of the latch cells via a first access transistor and from the second side of the latch cells via a second access transistors.

17. Latch circuitry apparatus comprising:
a plurality of latch cells each configured to store a bit of data;
a data line coupled to a first side of the plurality of latch cells;
a data false line coupled to a second side of the plurality of latch cells;
a write driver, comprising:
an input configured to receive the data;
a data false inverter coupled to the input and configured to generate a data false signal on the data false line by inverting the data; and
a pair of inverters coupled to the input and configured to generate a data signal on the data line, wherein the data used to generate the data false signal is not passed through the pair of inverters.

18. The latch circuitry apparatus of claim 17, wherein the data comprises fuse data configured to be used in routing memory data in a memory redundancy scheme for a memory device including the latch circuitry.

19. The latch circuitry apparatus of claim 17, comprising a plurality of write assist transistors each configured to assist the write driver in pulling down a voltage in a corresponding latch cell of the plurality of latch cells by decoupling latch inverters of the respective latch cell from a voltage supply based at least in part on a word line signal used to control access to the respective latch cell by the write driver via the data signal and the data false signal.

20. The latch circuitry apparatus of claim 19, wherein the data and data false signals are differential signals used to store the data in the latch cells based at least in part on the word line signal.

\* \* \* \* \*